US006842039B1

(12) United States Patent
Guzman et al.

(10) Patent No.: US 6,842,039 B1
(45) Date of Patent: Jan. 11, 2005

(54) CONFIGURATION SHIFT REGISTER

(75) Inventors: Mario Guzman, San Jose, CA (US);
Christopher Lane, San Jose, CA (US);
Andy Lee, San Jose, CA (US); Ninh Ngo, San Jose, CA (US)

(73) Assignee: Altera Corporation, San Jose, CA (US)

( * ) Notice: Subject to any disclaimer, the term of this patent is extended or adjusted under 35 U.S.C. 154(b) by 29 days.

(21) Appl. No.: 10/278,177

(22) Filed: Oct. 21, 2002

(51) Int. Cl.$^7$ .............................................. G01R 31/28
(52) U.S. Cl. .............................. 326/38; 326/39; 326/41; 714/727
(58) Field of Search ................ 326/38–41; 714/724–727

(56) References Cited

U.S. PATENT DOCUMENTS

| 4,750,155 | A | 6/1988 | Hsieh |
| 4,870,302 | A | 9/1989 | Freeman |
| 4,930,098 | A | 5/1990 | Allen |
| RE34,363 | E | 8/1993 | Freeman |
| 5,237,219 | A | 8/1993 | Cliff |
| 5,432,719 | A | 7/1995 | Freeman et al. |
| 5,453,706 | A | 9/1995 | Yee |
| 6,046,603 | A | 4/2000 | New |
| 6,057,704 | A | 5/2000 | New et al. |
| 6,091,263 | A | 7/2000 | New et al. |
| 6,128,215 | A | 10/2000 | Lee |
| 6,181,158 | B1 | 1/2001 | Cheung et al. |
| 6,255,849 | B1 * | 7/2001 | Mohan ........................ 326/41 |
| 6,269,020 | B1 | 7/2001 | Turner |
| 6,314,539 | B1 * | 11/2001 | Jacobson et al. ........... 714/727 |
| 6,353,551 | B1 | 3/2002 | Lee |
| 6,499,124 | B1 * | 12/2002 | Jacobson ..................... 714/727 |
| 6,608,500 | B1 * | 8/2003 | Lacey et al. .................. 326/39 |

OTHER PUBLICATIONS

"Boundary–Scan Testing in Altera Devices", IEEE 1149.1 (JTAG), Sep. 2000, ver. 4.05, Appl. note 39, 29 pgs.

* cited by examiner

Primary Examiner—Vibol Tan
(74) Attorney, Agent, or Firm—Morrison & Foerster LLP

(57) ABSTRACT

An electronic device comprises a first plurality of configuration elements connected as a shift register for programming a subset of the programmable functions of the electronic device. The subset of programmable functions may be reprogrammed by loading configuration data into the first plurality of configuration elements such that the subset of programmable functions may be reprogrammed without necessarily reprogramming other programmable functions of the electronic device.

26 Claims, 5 Drawing Sheets

CONFIGURATION SHIFT REGISTER

BACKGROUND OF THE INVENTION

1. Field of the Invention

The present invention relates to a configuration shift register for use in configuring programmable logic devices or other similar devices.

2. Description of Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to not necessarily exclude such devices.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. LABs (comprising multiple LEs) may be connected to horizontal and vertical conductors that may or may not extend the length of the PLD's core and connect to input/out ("I/O") blocks.

I/O blocks include buffers, registers, and may include other elements. I/O blocks (sometimes referred by other labels, e.g., I/O elements, or "IOEs", I/O buffers, I/O cells, "IOs", etc.) perform I/O functions that may include, for example, implementing I/O standards (e.g. LVTTL, LVCMOS, 2.5V, 1.8V, etc.) that define the requirements for transmitting/receiving a logical "1" or "0." I/O functions also may include, for example, buffering data, routing data to and from the various LEs of the PLD, the demultiplexing of signals, and other functions. I/O blocks and other circuitry such as, for example, phase locked loops (PLLs), delay locked loops (DLLs), and other clock circuitry may benefit from being proximate to the periphery and pins of the device.

PLDs have configuration elements that may be reprogrammed. Configuration elements may be realized as RAM bits, flip-flops, EEPROM cells, or other memory elements. Placing new data into the configuration elements programs or reprograms the PLD's logic functions. It is also becoming increasingly desirable to provide programmable I/O blocks that also contain configuration elements.

In some PLDs, the configuration elements are located in a dedicated memory region or regions. In other PLDs, the configuration elements are dispersed throughout the device. In either case, the configuration elements are typically treated together as an addressable array, or grid, that may be programmed with configuration data.

As the quantity of LEs, LABS, I/O blocks, and configuration elements in PLDs grows, the grid of configuration elements can become quite large. Today there is an increasing need for PLDs with a larger number of configuration elements. However, providing a PLD that has a large grid of configuration elements, for example, as large as 2,000×2,000 configuration elements organized in rows and columns, can create time inefficiencies during testing when particular subsets functions of the PLD may need to be repeatedly reprogrammed.

Applying a typical architecture and programming scheme to such a 2,000×2,000 grid of configuration elements would involve connecting the columns (or, alternatively, the rows) of such an array to, for example, a 2,000 row shift register for column-by-column (or alternatively, row-by-row) loading of configuration data into the configuration elements. Specifically, data for a column is loaded serially into a data shift register, and then the configuration data is loaded in parallel into all the rows (or in some instances a subset of all the rows) of a column. To reprogram the entire device, this process is repeated until new data is loaded into all of the configuration elements.

In those PLDs where the I/O blocks are programmable, the configuration elements for the I/O blocks are programmed along with the rest of the configuration elements. Those configuration elements that are relevant to configuration of I/O operations in a PLD would typically be located near the I/O pins which are dispersed around the edge of the PLD. Thus, I/O configuration elements may exist near the top and bottom of many columns across an entire grid of configuration elements. Thus, to reprogram all of the I/O elements, the entire grid of configuration elements must be reprogrammed.

For purposes of regular operation of a PLD by an ultimate end user, it generally does not pose a problem that the entire PLD must be programmed in order to reprogram a particular subset of functions performed by the PLD. Generally the end user would not need to frequently reconfigure the PLD by reprogramming the configuration elements. However, when testing the PLD, it may be necessary to frequently retest the PLD with different configurations. In particular, it may be necessary to frequently reprogram the PLD for purposes of testing the PLD with different configurations of its I/O elements. As the number of configuration elements in a PLD grows, this repeated reprogramming can become increasingly burdensome, particularly when testing multiple PLDs, and particularly given the increasing need to test a PLD with several different configurations of its I/O elements. In addition, it is desirable to be able to reprogram a portion of or the entire periphery of the chip while the core function is left intact. Alternatively, the core could be reprogrammed and the I/O blocks would still be programmed in a specific pattern to allow maintenance of system level functionality.

Therefore, a configuration element organization is needed that will make it possible to reprogram configuration elements relating to a subset of functions, such as, for example, I/O functions, without necessarily reprogramming an entire configuration grid containing other configuration elements not relating to the particular subset of functions. In addition, it is desirable to be able to reprogram a portion of or the entire subset of configuration elements while the grid containing the other configuration elements is left intact. Alternatively, it may be desirable for the grid to be reprogrammed and not the I/O functions, allowing system level functionality to be maintained.

SUMMARY OF THE INVENTION

The present invention provides an electronic device having configuration elements connected as a shift register, the configuration elements being relevant to a particular programmable function or subset of programmable functions such as I/O. The configuration shift register may be loaded with new data without having to reprogram other configuration elements of the electronic device. In an exemplary embodiment, the electronic device is a programmable logic device (PLD). In an aspect of an exemplary embodiment, shadow register elements allow programming data from one configuration to be maintained for particular IOs while new programming data for another configuration is loaded into the configuration shift register. In an aspect of a particular embodiment, a JTAG port of the PLD is used to load data into the configuration shift register and a demultiplexer selectively directs data to either a boundary scan chain of elements used for JTAG test data or to the configuration shift register. In another aspect of a particular embodiment, selected configuration elements in the configuration shift register are connected to pins for parallel loading of configuration data as an alternative to sequential loading of data into the configuration shift register from a single pin. In an alternative embodiment, cells of configuration elements forming the configuration shift register are interleaved with cells of elements used for JTAG test data forming a single shift register that may be used for rapidly reconfiguring particular programmable functions of the electronic device and also may be for boundary scan test purposes.

BRIEF DESCRIPTION OF THE DRAWINGS

The novel features of the invention are set forth in the appended claims. However, for purpose of explanation, several aspects of a particular embodiment of the invention and of an alternative embodiment of the invention are described by reference to the following figures.

DETAILED DESCRIPTION OF THE EXEMPLARY EMBODIMENTS

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
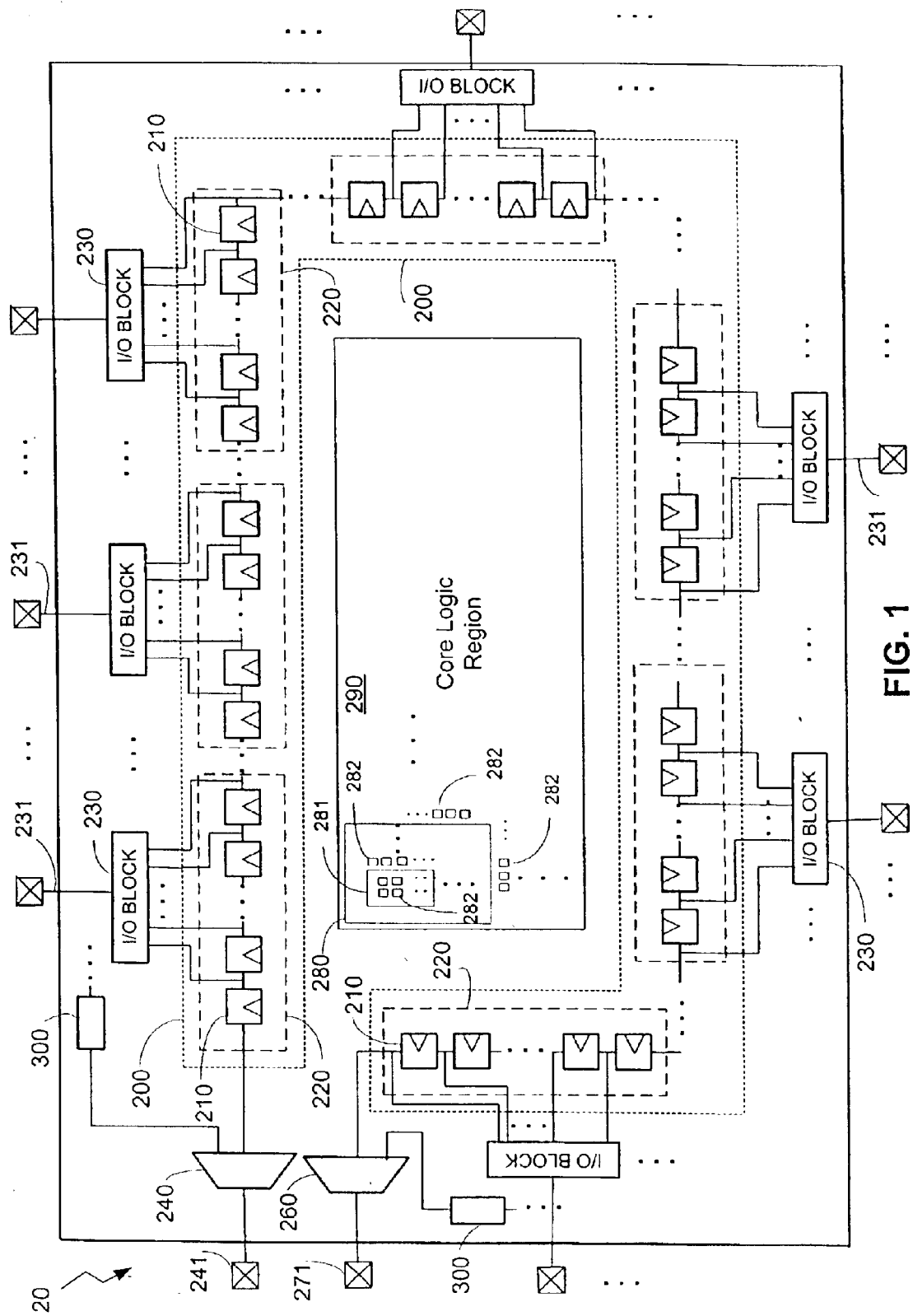
FIG. 1 is a diagram of a programmable logic device implementing an embodiment of the present invention including an I/O configuration shift register.

Referring to FIG. 1, a PLD 20 includes a core logic region 290 and an configuration shift register 200 outside of region 290. Configuration shift register 200 is coupled to a plurality of I/O blocks 230. Core logic region 290 includes logic elements (LEs) 281 grouped in blocks forming LABs 280. Only one LAB 280 and LE 281 is shown in any detail; however, repeating patterns of LABs 280, LEs 281 and configuration elements 282 are indicated with repeating dots. Core logic region 290 also includes configuration elements 282. As illustrated, configuration elements 282 include elements inside of LEs 281, outside of LEs 281, and outside of LABs 280. Configuration elements 282 include elements holding data to configure the logic functions of LEs 281 as well as configuration elements to determine connections between various elements of PLD 20 (e.g. connections between LEs 281, connections between LABs 280, connections between LEs 281 and I/O blocks 230, etc.). Connection wires and input and output muxes for programming the various interconnections between various elements such as LEs 281 are not separately shown.

Configuration flip flops 210 are connected as a shift register. Any segment of two or more connected flip flops 210 may be defined as a "shift register" as that term is used herein. However, in particular, configuration flip flops 210 are connected in configuration shift register cells (i.e. groups of connected configuration elements) 220, indicated by inner dashed lines, and configuration flip flops 210 are connected to form configuration shift register 200 indicated by the outer dashed line around flip flops 210 and cells 220.

Configuration shift register 200 is coupled to pin 241. Configuration shift register is implemented relative to core logic region 290 so that configuration data may be pushed into configuration shift register 200 through pin 241 to program I/O configuration elements 210 without necessarily having to reprogram configuration elements 282 in core region 290 of PLD 20. This facilitates rapid reprogramming of PLD 20's I/O functions for testing purposes. I/O functions may be reprogrammed without necessarily having to power down PLD 20 and without having to reprogram other configuration elements (i.e. configuration elements 282) in PLD 20. The I/O function may also be modified, in full or in part, multiple times to allow the testing and/or use of various I/O settings by the user. For a description of partial modification of I/O functions, see FIG. 4 and accompanying text.

Figure 3:
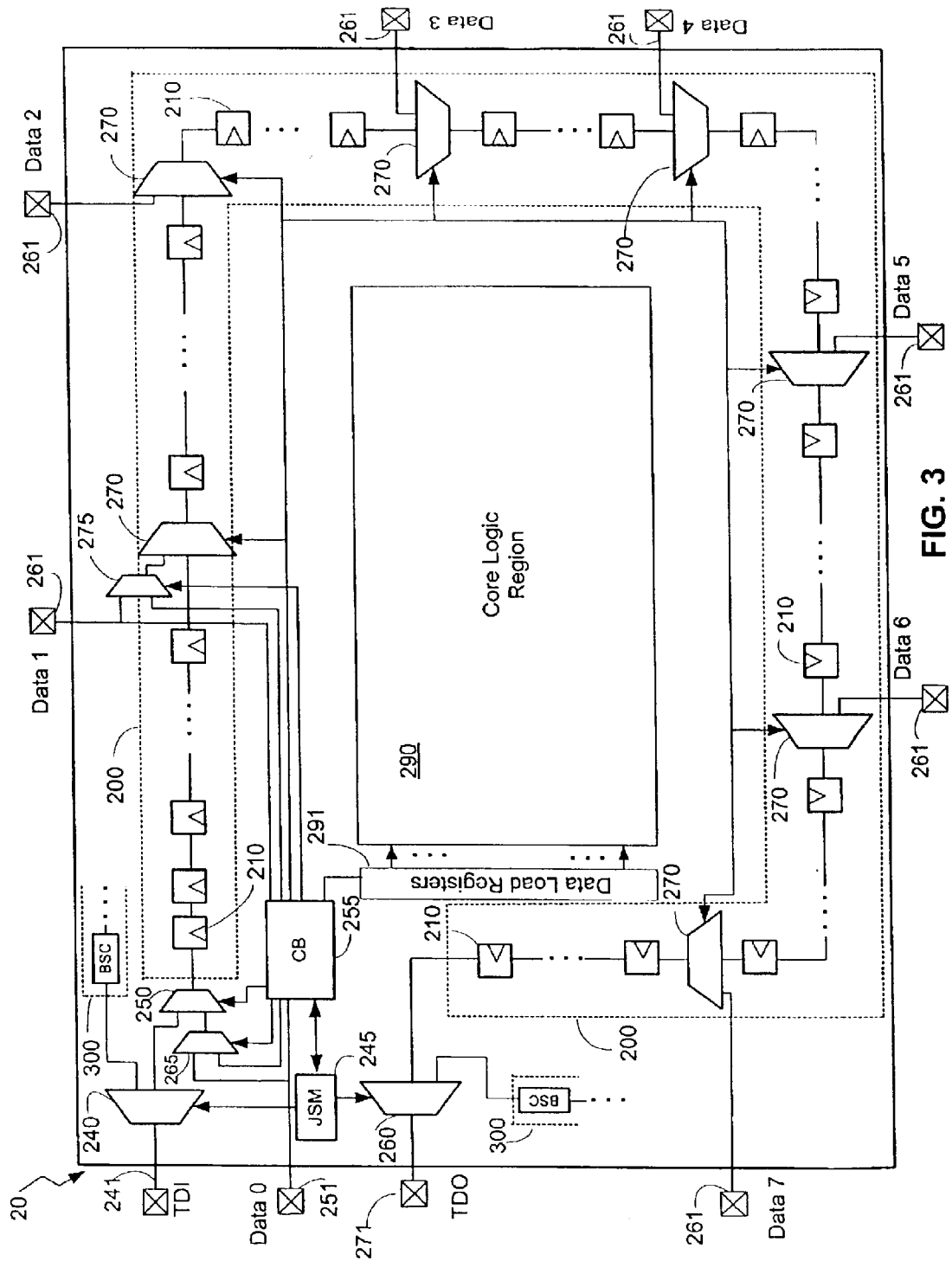
FIG. 3 is another diagram of the programmable logic device of FIG. 1 and highlights connections to pins that may be used for alternative parallel loading of data into the configuration shift register of FIG. 1.

Also, in another aspect of this exemplary embodiment (illustrated and described in more detail in FIG. 3 and accompanying text), shift register 200 is segmented with multiplexers (muxes) that provide access to configuration elements at selected intermediate points in shift register 200. In the exemplary embodiment, the same pins used for configuring the entire PLD can be used to load data into configuration shift register 200 either before or after programming the matrix of other configuration elements 282 as illustrated and described in FIG. 3 and accompanying text. As shown in FIG. 3, the data loaded into the shift register 200 may come directly from external pin 251 and pins 261, or it may be routed through Control Block 255 to test for data accuracy or for other data checking purposes.

Continuing with the description of FIG. 1, I/O blocks 230 are connected to I/O pins 231. I/O blocks 230 include I/O components for carrying out I/O functions (I/O components internal to I/O blocks 230 not separately shown). Configuration flips flops 210 connect to I/O blocks 230 for driving I/O blocks 230 to one of a plurality of prescribed I/O configuration states. Blocks 230 are driven to one of a plurality of prescribed I/O configuration states, which does not necessarily imply that each block 230 is driven to the same state. For example, a first block 230 may be driven to a different prescribed state than a second block 230 because, as illustrated in FIG. 1, each I/O block 230 is connected to a different group of configuration elements 210. An I/O configuration state might include, for example, conformance to a particular data signaling standard. An I/O configuration state might also include, for example, establishing connections relevant to supporting a particular routing of data between pins 231 and LEs 281.

The configuration elements used to configure an I/O block 230 may all be part of a corresponding configuration cell 220 in shift register chain 200 or only some of the configuration memory elements may be part of the chain. For instance, it may not be necessary or desirable to allow certain bits to be reconfigured and thus it may be beneficial to remove them from a cell 220 in the shift register chain 200.

As stated, configuration shift register 200 is coupled to input pin 241. Data may be pushed into configuration shift register 200 through input pin 241. The term "pins" as used herein includes one or more conductive paths from one device for connection to another device or data source. "Pins" as used herein may refer to one or more male connector heads for insertion into a female connector, or for soldering to a printed circuit board to complete a conductive path or paths between devices. However, the term pins as used herein has a broader definition and may therefore also simply refer to a conductive path (or paths) itself, whether or not the conductive path is capable of being readily disconnected and reconnected through, for example, soldering to a circuit board.

For ease of illustration, configuration shift register 200 and associated flip flops 210, I/O blocks 230, and I/O pins 231 are all shown much larger in FIG. 1 relative to PLD 20 and core logic region 290 than would be the case were those elements drawn to scale relative to the rest of PLD 20. Also, as would be understood by one skilled in the art, a configuration shift register such as configuration shift register 200 implemented in a device such as PLD 20 would typically include a far greater number flip flops and would feed a greater number of I/O blocks than are illustrated in FIG. 1. FIG. 1 shows a limited number of flip flops, I/O blocks, and I/O pins for illustrative purposes only, and indicates the presence of additional elements, cells, blocks, and pins through the use of repeating dots.

To the extent that configuration shift register is located closer to the perimeter of PLD 20 relative to region 290, and may therefore come into greater contact with electrical noise than would the interior of region 290, it is preferable that the configuration shift register 200 use flip flops for its configuration elements 210 rather than using typical RAM bit circuits. Flip flops tend to have more robust circuitry and are thus less susceptible to noise than some of the simpler circuits that are often used for RAM elements. However, those skilled in the art will appreciate that it is possible to use configuration elements for configuration shift register 200 that are not flip flops without necessarily departing from the spirit and scope of the invention.

When configuration shift register 200 is being loaded with configuration data, transistors between I/O blocks 230 and configuration elements 210 are switched off (transistor switches not separately shown) so that the states of I/O blocks 230 are not continuously changing while configuration data is being loaded. After configuration data is loaded, these transistor switches are turned on so that configuration bits at the outputs of each flip flop 210 drive I/O blocks 230 to one of a plurality of prescribed states. To allow the use of certain pins during configuration, a portion of the shift register may be forced into a default state so that the pins act according to a selected I/O standard while the shift register 200 is being loaded.

Figure 2:
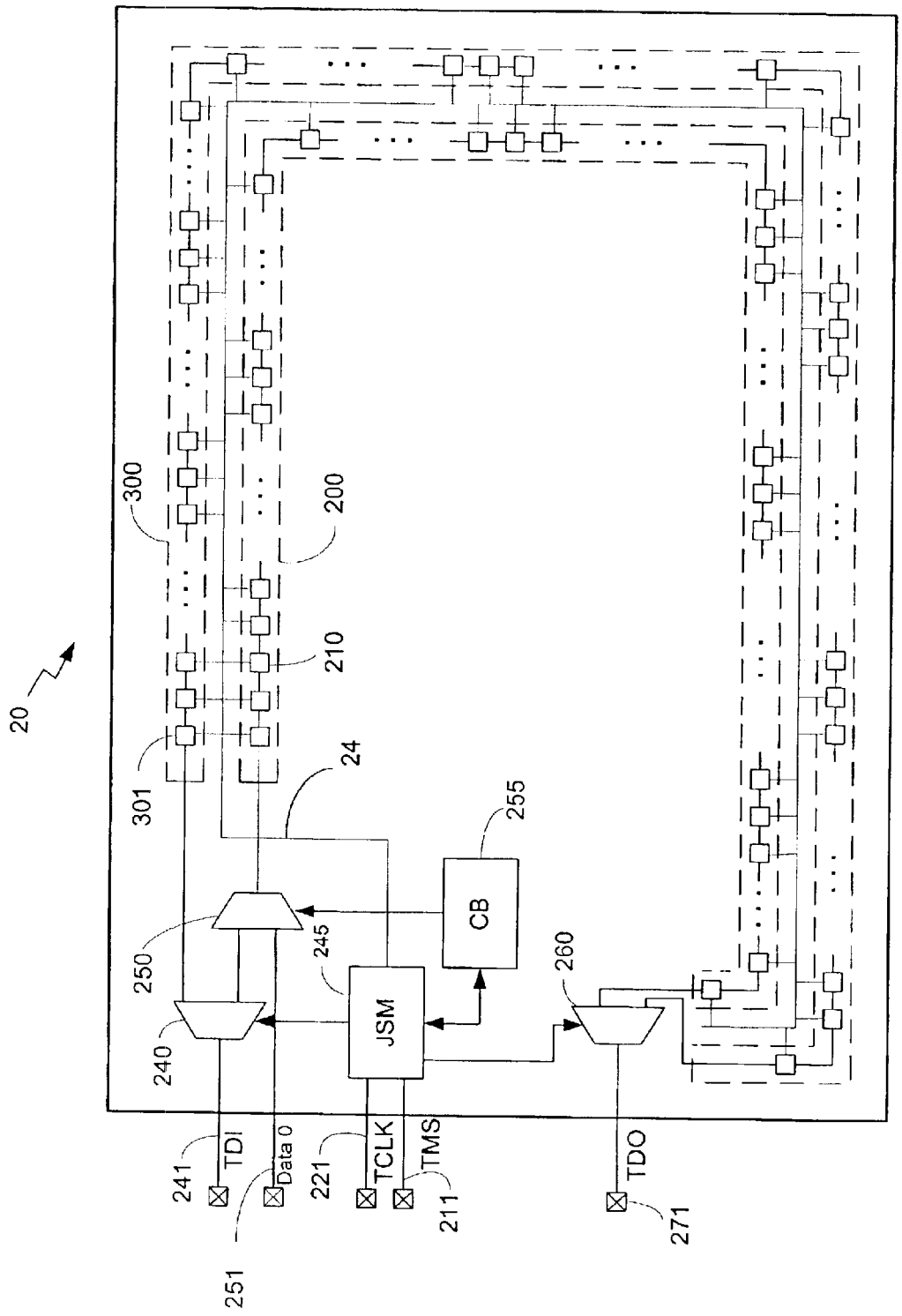
FIG. 2 is another diagram of the programmable logic device of FIG. 1 highlighting implementation of the configuration shift register of FIG. 1 relative to a boundary scan chain for JTAG testing wherein an input pin utilized for JTAG test data may also be used for inputting data to the configuration shift register.

Demultiplexer ("demux") 240 and multiplexer ("mux") 260 allows configuration shift register 200 to share, respectively, an input pin and an output pin with boundary scan chain 300, as discussed in more detail in relation to FIG. 2.

FIG. 2 is a view of PLD 20 of FIG. 1 that highlights the implementation of configuration shift register 200 relative to a boundary scan chain ("BSC") 300 used for implementing the Joint Test Action Group ("JTAG") specification requirements. The JTAG specification requires dedicated elements, typically organized as a chain of cells each cell having elements for holding three bits per cell. This chain of dedicated elements is used to facilitate the testing of integrated circuit devices. Such a chain is referred to as "Boundary Scan Chain" or "BSC." BSC 300 is made up of BSC elements 301.

As illustrated in FIG. 2, PLD 20 also includes JTAG state machine ("JSM") 245, control block ("CB") 255, demultiplexer ("demux") 240, multiplexer ("mux") 250, and mux 260. As shown, JSM 245 is separate from CB 255, but JSM 245 might be located within CB 255 in alternative embodiments. In the illustrated embodiment, JSM 245, on direction from CB 255, sends a signal to demux 240 indicating whether the data input through pin 241 to demux 240 should be routed to BSC 300 or to configuration shift register 200. The circuitry shown in FIG. 2 allows pin 241 to function as both the Test Data In pin ("TDI") in compliance with the JTAG specification and as an input pin for receiving I/O bits to reprogram shift register 200. TDI is one of the five pins required by the JTAG specification. Other JTAG pins illustrated are Test Clock ("TCK") pin 221, Test Mode Select ("TMS") pin 211, and Test Data Out ("TDO") pin 271. CB 255 sends a signal to mux 250 indicating whether data to configuration shift register 200 will come from input pin 241 via demux 240, or whether data will come from pin 251. Generally, when programming configuration shift register 200 for I/O testing purposes, data will be loaded into shift register 200 from TDI input pin 241 via demux 240 and mux 250. However, when programming configuration shift register 200 for regular operation then configuration data will be loaded into configuration shift register 200 at pin 251 via mux 250 and at pins 261 via muxes 270 (additional data input pins 261 and muxes 270 illustrated and described in FIG. 3 and accompanying text).

A clock signal for JTAG testing is fed into JSM 245 through Test Clock ("TCK") pin 221 for distribution to BSC 300 over line 24. A clock signal delivered over line 24 may be shared by both BSC 300 and configuration shift register 200. As shown, line 24 is connected to configuration elements 210 and to boundary scan elements 301.

FIG. 3 is another illustration of PLD 20 that highlights alternative parallel loading of data into configuration shift register 200 from multiple data input pins. As illustrated, PLD 20 includes first data input pin 251 (also labeled Data 0) and a plurality of second data input pins 261 (also labeled Data 1–Data 7). Other PLDs may include a fewer or greater number of second data input pins without departing from the spirit and scope of the present invention. PLD 20 also includes a plurality of muxes 270 interspersed between selected intermediate configuration elements 210. A first input of each respective one of the plurality of muxes 270 is coupled to a respective one of the plurality of pins 261. A second input of each respective one of the plurality of muxes 270 is coupled to an output of a respective one of the plurality of intermediate configuration elements 210 (a subset of configuration elements 210). An output of each respective one of the plurality of muxes 270 is coupled to an input of respective other one of the plurality of intermediate configuration elements 210.

Control block 255 sends a signal to mux 250 and to muxes 270 depending on whether configuration data is being loaded through input 241, or through input 251 and inputs 261. A configuration shift register such as configuration shift register 200 may have 8,000 flip flops 210 holding I/O configuration data. When data is loaded into configuration shift register 200 though inputs 251 and 261, data may be loaded in less time due to parallel loading. However, if muxes 270 receive a signal from control block 255 for each of muxes 270 to select data at outputs of respective intermediate configuration elements 210 for outputting to inputs of respective other intermediate configuration elements 210, then all data is loaded into configuration shift register 200 through either input 241 or input 251 (both of which are coupled to shift register 200) depending on the control signals sent to mux 250.

Generally, during testing, new configuration data will be loaded via pin 241 (or pin 251 could be used) sequentially into the entire shift register 200. When programming for regular use, data input pin 251 (marked data 0) and data input pins 261 (marked data 1–7) may be used for parallel loading of data into configuration shift register 200 from multiple points along shift register 200 as illustrated. In such instances, mux 250 and muxes 270 receive a signal from control block 255 for each mux to select data at respective data input pins (pin 251 and pins 261) for loading into inputs of respective intermediate I/O configuration elements 210. Data from pins 251 and 261 may pass directly from the pin to mux 270 or 250, or the data may alternatively pass through other internal logic, such as Control Block 255 before driving into mux 270 or 250. The Control Block 255 may perform CRC check or other data accuracy checks before allowing the device to be programmed. As shown, mux 265 allows data provided either directly from pin 251 or from CB 255 to be selected for input into mux 250. Also, respective muxes 275 allow data provided either directly from pins 261 or from CB 255 to be selected for input into respective muxes 270. A mux 275 is shown interposed between a pin 261 (Data 1), a mux 270, and CB 255. Additional muxes 275 exist corresponding to other pins 261 and muxes 270, but such additional muxes 275 and associated connections to CB 255 are not separately shown so as not to overcomplicate the drawing.

When programming for regular use, pin 251 and pins 261 are also used for programming the configuration matrix of core region 290 comprising configuration elements 282 (see FIG. 1 and accompanying text). In the exemplary embodiment, this is accomplished by connecting the lines from pins 261 (and 251) to muxes 270 (mux 250 in the case of pin 251) and to control block 255. Such a connection from data pin to control block ("CB") 255 is shown for the pin 261 marked "data 1", and such a connection exists but is not separately shown from the pin 251 (marked "data 0") and the other pins 261 (marked data 2–7) to CB 255. By recognizing the time of delivery of configuration data for programming core region 290 as distinct from the time of delivery of I/O configuration data, CB 255 is able to determine the proper routing of incoming configuration data. When CB 255 recognizes incoming data as I/O configuration data, it sends an enable signal to mux 250 and muxes 270 so that each mux selects data from data pins 0–7 (pin 251 and pins 261) for loading into I/O configuration elements 210. However, when control block 255 recognizes incoming data for programming core 290, then CB 255 routes such data to data load registers 291 for loading data into the configuration grid comprising elements 282 (see FIG. 1). Note that in a preferred embodiment, data load registers 291 comprise two registers: A first register being a data shift register for receiving data in series from CB 255 and a second for loading data from the first register in parallel to a column in the array of configuration elements 282 based on a column address provided by an address register (address register not separately shown). However, in alternative embodiments, data load registers may comprise a fewer or greater number of registers. When data is input through data 0–7 (pin 251 and pins 261) for the load registers for loading configuration data into configuration elements 282, CB 255 does not enable mux 250 and muxes 270 so that non-I/O configuration data is not loaded into configuration elements 210.

Those skilled in the art will recognize that in alternative embodiments, during testing, either multiple pins might be used for loading I/O configuration data in parallel or a single pin might be used for serial loading of I/O configuration data. Similarly, when programming for regular operation, alternative embodiments might use single pin/serial loading or multiple pin parallel loading. Such alternatives and alternatives using a few or greater number of pins than is shown in the illustrated embodiment would not depart from the spirit and scope of the present invention. Furthermore, in other alternatives, additional pins might be added so that one set of pins might be used only for testing purposes and another set of pins might be used only for regular loading and operation of the device. In such other alternatives, one set of pins might drive a control block (which might in turn drive a configuration shift register) and another set of pins might drive muxes coupled to elements in the configuration shift register.

Figure 4:
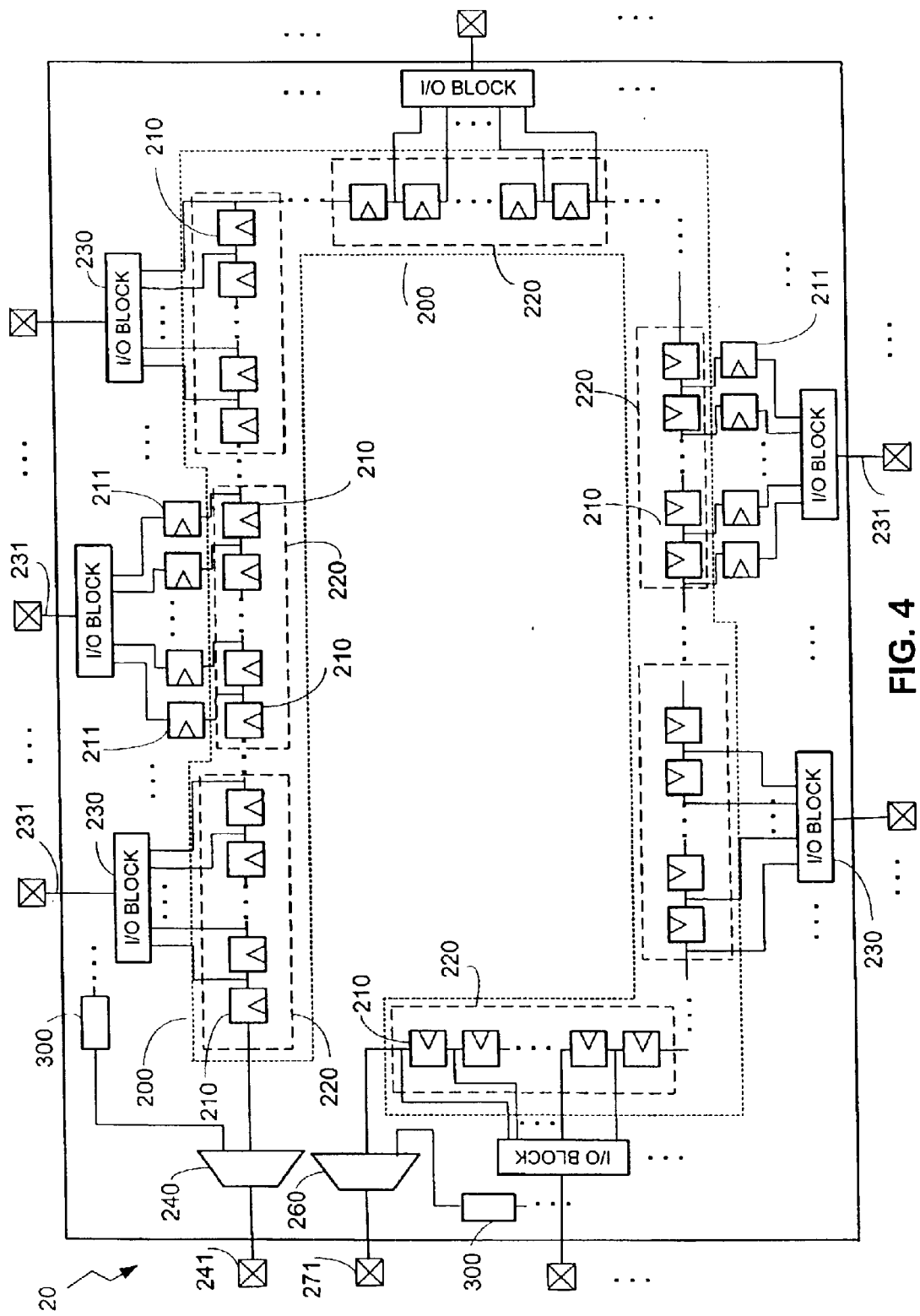
FIG. 4 is another diagram of the programmable logic device of FIG. 1 and highlights use of shadow register configuration elements to facilitate retaining a portion of data from a first set of configuration data while loading data from a second set of configuration data into the configuration shift register.

FIG. 4 is another illustration of PLD 20 that shows the use of shadow register configuration elements to facilitate retention of configuration data for some I/Os. As illustrated, shadow configuration elements 211 are coupled between certain I/O blocks 230 and configuration elements 210. Shadow configuration elements 211 are coupled to a different clock signal line than are configuration elements 210 (clock signal lines not separately shown). Loading data into configuration elements 210 and 211 may proceed as follows: a first set of configuration data may be loaded into configuration elements via serial or parallel loading as previously described utilizing a first clock signal. Data from the first set of configuration data may be latched by shadow configuration elements 211 utilizing a second clock signal. I/O blocks 230 are connected directly to configuration elements 210 where shadow configuration elements 211 are not present, are connected to shadow configuration elements 211 where such elements are present.

A second set of configuration data may be loaded into configuration elements 210 utilizing a first clock signal without displacing the portion of the first set of configuration data that is retained by the shadow configuration elements 211. In this manner, those I/O blocks 230 that are connected directly to configuration elements 210 may be configured by data from the second set of configuration data while those I/O blocks 230 that are connected to shadow configuration elements 211 may continue to be configured by data from the first set of configuration data. Alternatively, a second clock signal may be utilized to latch data from the second set of configuration data into shadow configuration elements 211 so that all I/O blocks 230 are programmed with the data from the second set of configuration data.

Note that because shadow elements 211 can continue to hold configuration data from the first set of configuration data while the second set is loaded into elements 210, it is not necessary to tristate the output of elements 211 to I/O blocks 230 during the loading of data into the elements 210.

The illustrated embodiment may, as an alternative, be modified to provide respective 2:1 muxes between, on the one hand, respective complementary pairs comprising a configuration element 210 and a shadow register element 211, and on the other hand, an I/O block 230. Such 2:1 muxes would be coupled to receive as inputs the outputs of respective configuration elements 210 and shadow register elements 211 and to provide outputs to an I/O block 230. A control signal can then be provided to such muxes so that, for example, a user could dynamically switch selection between two different configurations, one configuration being defined by data in configuration elements 210 and another configuration being defined by data in shadow register elements 211.

Figure 5:
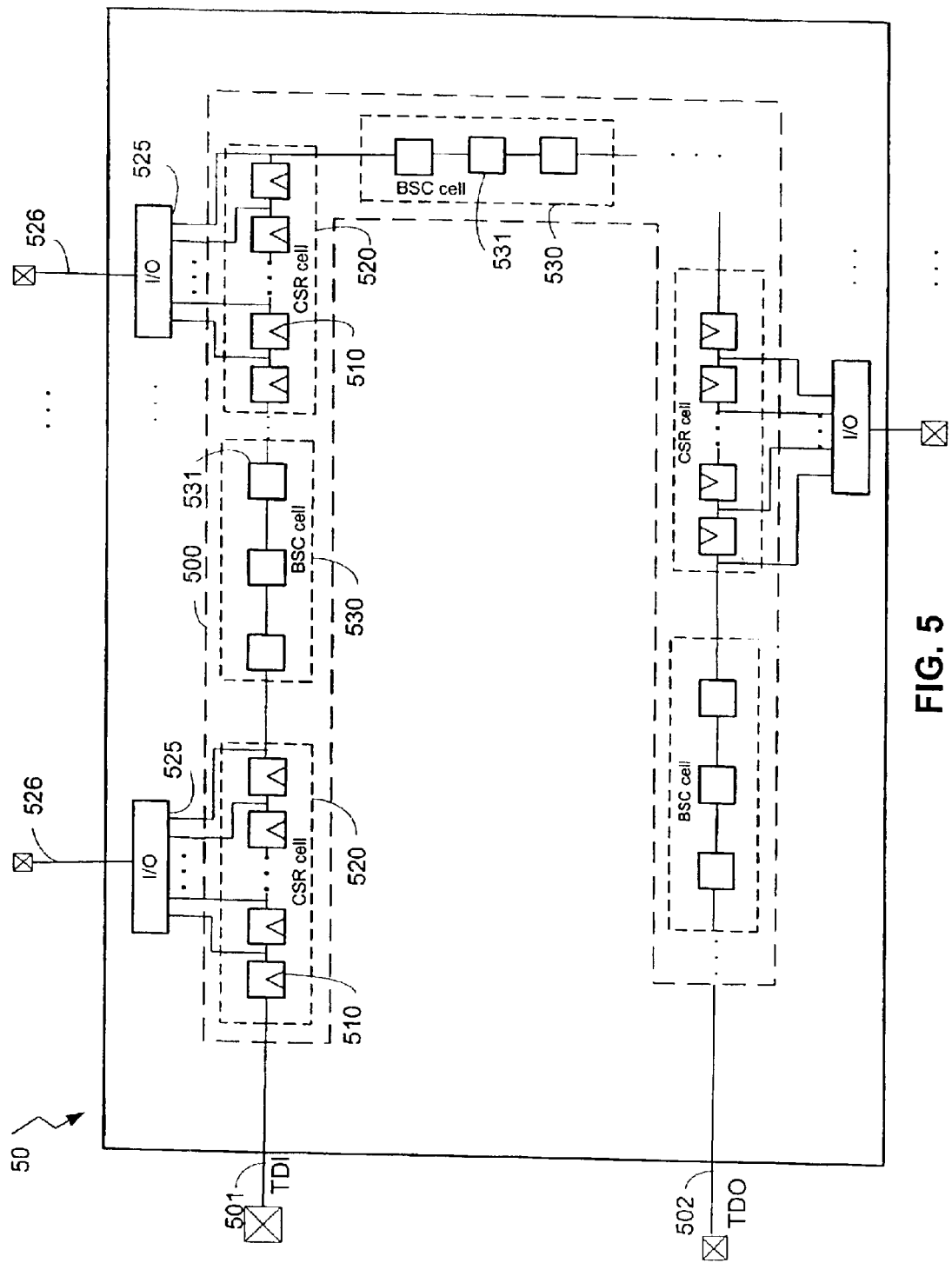
FIG. 5 shows an alternative implementation of a configuration shift register in a PLD relative to a boundary scan chain.

FIG. 5 shows an alternative implementation of configuration shift register cells relative to boundary scan chain cells. In the implementation shown in FIG. 5, alternating cells 520 and 530 are combined to form a shift register 500 in PLD 50 (i.e. cells 520 and 530 are interleaved). I/O configuration shift register cells 520 of flip flops 510 are coupled to corresponding I/O blocks 525 for providing I/O configuration bits driving I/O blocks 525 to one of multiple prescribe configuration states. Boundary scan elements 531 (grouped into cells 530) each may hold data bits relevant to JTAG boundary scan testing. During testing, proper loading of I/O configuration data into shift register 500 for repeated I/O testing can be ensured by accounting for the number of BSC cells 530 of BSC elements 531 between each of the I/O configuration cells 520 of I/O configuration flip flops 510.

Although particular embodiments have been described in detail, various modifications to the embodiments described herein may be made without departing from the spirit and scope of the present invention, thus, the invention is limited only by the appended claims.

What is claimed is:

1. An integrated circuit comprising:
a plurality of I/O blocks;
a plurality of I/O configuration elements including outputs, the I/O configuration elements being coupled together as a shift register on a periphery of the integrated circuit, and the I/O configuration elements also being coupled to the plurality of I/O blocks for driving, each of the plurality of I/O blocks to one of multiple prescribed I/O configuration states based upon configuration bits provided at the outputs of the plurality of I/O configuration elements;
a boundary scan chain comprising a plurality of boundary scan elements;
a first pin; and
a demultiplexer including at least an input, a first output, and a second output, the input being coupled to the first pin, the first output being coupled to a first one of the plurality of I/O configuration elements, the second output bin coupled to the boundary scan chain, the demultiplexer being for selecting either the configuration shift register the bound scan chain to receive data through first pin.

2. The integrated circuit of claim 1 further comprising a clock signal distribution line coupled to the plurality of I/O configuration elements and to the plurality of boundary scan elements for carrying a clock signal useable by both the plurality of I/O configuration elements and the plurality of boundary scan elements.

3. The integrated circuit of claim 1 wherein the I/O configuration elements include flip fops.

4. The integrated circuit of claim 2 wherein the I/O configuration elements include flip flops.

5. An integrated circuit comprising:
a plurality of I/O blocks; and
a multiple input shift register including:
a plurality of configuration elements coupled to the shift data between configuration elements; and
a plurality of respective multiplexers respectively coupled between respective pairs of configuration elements, the respective multiplexers respectively including a respective first multiplexer input coupled to a data source external to the sift register, a respective second multiplexer input connected to a respective first configuration element of a respective pair of configuration elements, and a respective multiplexer output connected to a respective second configuration element of the respective pair of configuration elements;
wherein configuration elements of the shift register are coupled to drive respective I/O blocks to prescribed configuration states.

6. The integrated circuit of claim 5 wherein the respective multiplexers include respective control inputs to respectively select either respective input data from the data source or respective shifted data from the respective first configuration element of the respective pair of configuration elements.

7. The integrated circuit of claim 5 wherein the integrated circuit is a programmable logic device.

8. The integrated circuit of claim 6 wherein the data source is a respective input pin.

9. The integrated circuit of claim 6 further comprising:
a boundary scan chain comprising a plurality of boundary scan elements; and
a demultiplexer having at least an input, a first output, and a second output, the input of the demultiplexer being coupled to an input pin, the first output of the demultiplexer being coupled to a first multiplexer input, the second output of the demultiplexer being coupled to the boundary scan chain, the demultiplexer being for selecting either the first multiplexer input or the boundary scan chain to receive data through the input pin.

10. The integrated circuit of claim 9 further comprising a clock signal distribution line coupled to the plurality of I/O configuration elements and to the plurality of boundary scan elements for distributing a clock signal useable by both the plurality of configuration elements and by the plurality of boundary scan elements.

11. A shift register comprising:
a first plurality of cells, each of the first plurality of cells comprising a plurality of configuration elements coupled together for shifting data; and
a second plurality of cells coupled to the first plurality of cells, each of the second plurality of cells comprising a plurality of boundary scan elements coupled together for shifting data, wherein the first plurality of cells and the second plurality of cells are interleaved.

12. A shift register comprising:

a first plurality of cells, each of the first plurality of cells comprising a plurality of configuration elements coupled together for shifting data; and a second plurality of cells coupled to the first plurality of cells, each of the second plurality of cells comprising a plurality of boundary scan elements coupled together for shifting data, wherein the plurality of configuration elements are I/O configuration elements having outputs, the outputs of the plurality of I/O configuration elements being coupled to at one I/O block for driving the at least one I/O block to one of a plurality of prescribed states based upon configuration bits provided at the outputs of the plurality of configuration elements.

13. The shift raster of claim 11 wherein the plurality of configuration elements include flip flops.

14. The shift register of claim 12 wherein the plurality of configuration elements include flip flops.

15. A programmable logic device comprising the shift register of claim 11.

16. A programmable logic device comprising the shift register of claim 12.

17. A programmable logic device comprising the shift register of claim 13.

18. A method of configuring I/O blocks of an electronic device comprising:

providing I/O configuration elements coupled together as a shift register on a periphery of the electronic device and coupled for driving the I/O blocks to one of a plurality of prescribed states;

loading configuration data into the I/O configuration elements;

providing a demultiplexer including an input coupled to an input pin of the electronic device, a first output coupled to a boundary scan chain and a second output coupled to at last one of the plurality of I/O configuration elements;

when loading boundary scan chain test data through the input pin, causing the demultiplexer to select the first output coupled to the boundary scan chain; and when loading I/O configuration data through the input pin, causing the demultiplexer to select the second output coupled to the at least one of the plurality of I/O configuration elements.

19. An integrated circuit including a core and a periphery, the integrated circuit comprising:

first programmable elements controlling functions of core circuitry of the integrated circuit;

second programmable elements different from the first programmable elements, the second programmable elements coupled together to form a shift register that controls at least one function of periphery circuitry of the electronic device; and third programmable elements wherein the shifter register only controls a subset of the periphery circuitry and third programmable elements control another subset of the periphery circuitry.

20. The integrated circuit of claim 19, wherein the first and third programmable elements are the same.

21. The integrated circuit of claim 19, wherein the at least one function include phase lock loop operation.

22. The integrated circuit of claim 19, wherein the at least one function includes delay lock loop operation.

23. The integrated circuit of claim 19 wherein the at least one function includes I/O operation.

24. An integrated circuit including circuitry controlled by programmable elements, the integrated circuit comprising:

first programmable elements coupled together to form a shift register;

second programmable element coupled to at least some of the first programmable element so that second configuration data can be shifted into the first programmable elements without displacing first configuration data previously stored in the second programmable elements;

a first clock signal line coupled to the first programmable element; and a second clock signal line coupled to the second programmable elements;

wherein the first programmable elements shift data in response to a signal on the first clock signal line and the second programmable elements latch data from at least some of the first programmable elements in response to a signal on the second clock signal line.

25. An integrated circuit including circuitry controlled by programmable elements, the integrated circuit comprising:

first programmable elements coupled together to form a shift register;

second programmable elements coupled to at least some of the first programmable elements so that second configuration data can be shifted into the first programmable elements without displacing first configuration data previously stored in the second programmable elements; and multiplexers coupled to receive as inputs data provided by first and second programmable elements and coupled to provide as a selected output either data provided by the first programmable elements or data provided by the second programmable elements wherein the selected output is provided to circuitry controlled by the either of the first and second programmable elements.

26. A method of configuring and reconfiguring circuitry of an electronic device comprising:

providing first configuration elements coupled together as a shift register and coupled to circuitry controlled by the first programmable elements;

providing second configuration elements coupled to circuitry controlled by the second configuration elements and coupled to at least some of the first configuration elements;

loading first configuration data into the first configuration elements;

latching at least some of the first configuration data from at least some of the first configuration elements into the second configuration elements; and loading second configuration data into the first configuration elements.

* * * * *